United States Patent
Cruz-Albrecht et al.

(10) Patent No.: US 7,592,939 B1
(45) Date of Patent: Sep. 22, 2009

(54) DIGITAL DOMAIN TO PULSE DOMAIN TIME ENCODER

(75) Inventors: Jose Cruz-Albrecht, Oak Park, CA (US); Peter Petre, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/118,475

(22) Filed: May 9, 2008

(51) Int. Cl.
H03M 1/66 (2006.01)
(52) U.S. Cl. .................................. 341/144; 341/155
(58) Field of Classification Search .............. 341/144, 341/143, 155, 200
See application file for complete search history.

(56) References Cited

U.S. PATENT DOCUMENTS

| | | | |
|---|---|---|---|
| 5,345,398 A * | 9/1994 | Lippmann et al. | 702/53 |
| 5,479,170 A | 12/1995 | Cauwenberghs et al. | 341/200 |
| 5,894,280 A * | 4/1999 | Ginetti et al. | 341/118 |
| 6,452,524 B1 * | 9/2002 | Fraleigh et al. | 341/143 |
| 6,473,019 B1 | 10/2002 | Ruha et al. | 341/143 |
| 6,975,682 B2 | 12/2005 | Cosand | 375/247 |
| 7,038,608 B1 * | 5/2006 | Gilbert | 341/144 |
| 7,403,144 B1 | 7/2008 | Cruz-Albrecht et al. | 341/143 |
| 7,405,686 B2 * | 7/2008 | Laroia et al. | 341/143 |

OTHER PUBLICATIONS

Cruz, J.M., et al., "A 16×16 Cellular Neural Network Universal Chip: The First Complete Single-Chip Dynamic computer Array with Distributed Memory and with Gray Scale Input-Output," Analog Integrated Circuits and Signal Processing, 15, 227-237 (1998).
Dighe, A.M., et al., "An Asynchronous Serial Flash Converter," 9th Int. Conf. On Electronics, Circuits and Systems, 2002.
Iwamoto, M., et al., "Bandpass Delta-Sigma Class-S Amplifier," Electronic Letters, vol. 36, No. 12, pp. 1010-1012 (Jun. 2000).
J. Keane and L Atlas, "Impulses and stochastic arithmetic for signal processing," Proc. 2001 IEEE International Conference on Acoustics, Speech, and Signal Processing, pp. 1257-1260, 2001.
Lazar, A., et al., "Perfect Recovery and sensitive analysis of time encoded bandlimited signals," IEEE Transactions on Circuits and Systems-1 Regular Papers, vol. 51, No. 10, Oct. 2004.
Roza, E., Analog to Digital Conversion via Duty cycle Modulation, IEEE trans. Ojn Circuits and Systems-II, vol. 44, No. 11, pp. 907-914 (Nov. 1997).

(Continued)

Primary Examiner—Peguy JeanPierre
(74) Attorney, Agent, or Firm—Ladas & Parry

(57) ABSTRACT

A system and method for making a digital encoder. The digital encoder has a digital-to-analog converter having multiple inputs and an output. The encoder also has an integrator having an input and an output, wherein the output of the digital-to-analog converter is connected to the input of the integrator. A quantizer has an input and an output, wherein the output of the integrator is connected to the input of the quantizer, and the output of the quantizer is connected to one of the plurality of inputs of the digital-to-analog converter. Methods to make the foregoing structure are also described.

20 Claims, 10 Drawing Sheets

Digital-Input Time Encoder

OTHER PUBLICATIONS

Walden, R., "Analog to Digital Converter Survey and Analysis," IEEE Journal on Selected Areas in Communications, vol. 17, No. 4, pp. 539-550 (Apr. 1999).

U.S. Appl. No. 11/726,484, filed Mar. 22, 2007, Cruz-Albrecht, Jose, et al.

U.S. Appl. No. 60/984,354, filed Oct. 31, 2007, Cruz-Albrecht, Jose.

U.S. Appl. No. 60/984,357, filed Oct. 31, 2007, Petre, Peter.

D. Donoho, "Compressed Sensing," IEEE Transactions on Information Theory, vol. 42, No. 4, pp. 1289-1306, Apr. 2006.

Y. Xia and J. Wang, "A Recurrent Neural Network for Solving Nonlinear Convex Programs Subject to Linear Constraints," IEEE Trans. On Neural Networks, vol. 16, No. 2, Mar. 2005.

* cited by examiner

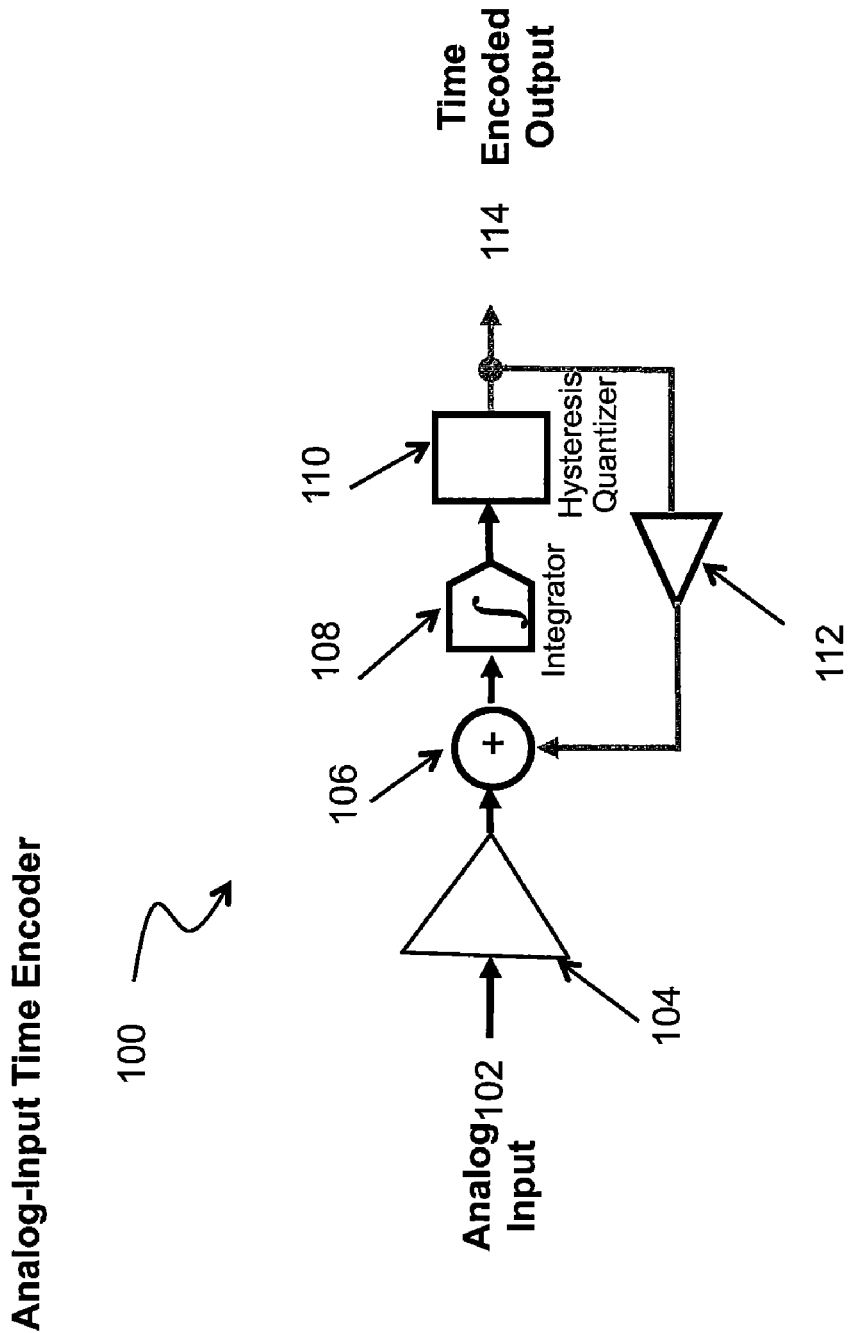

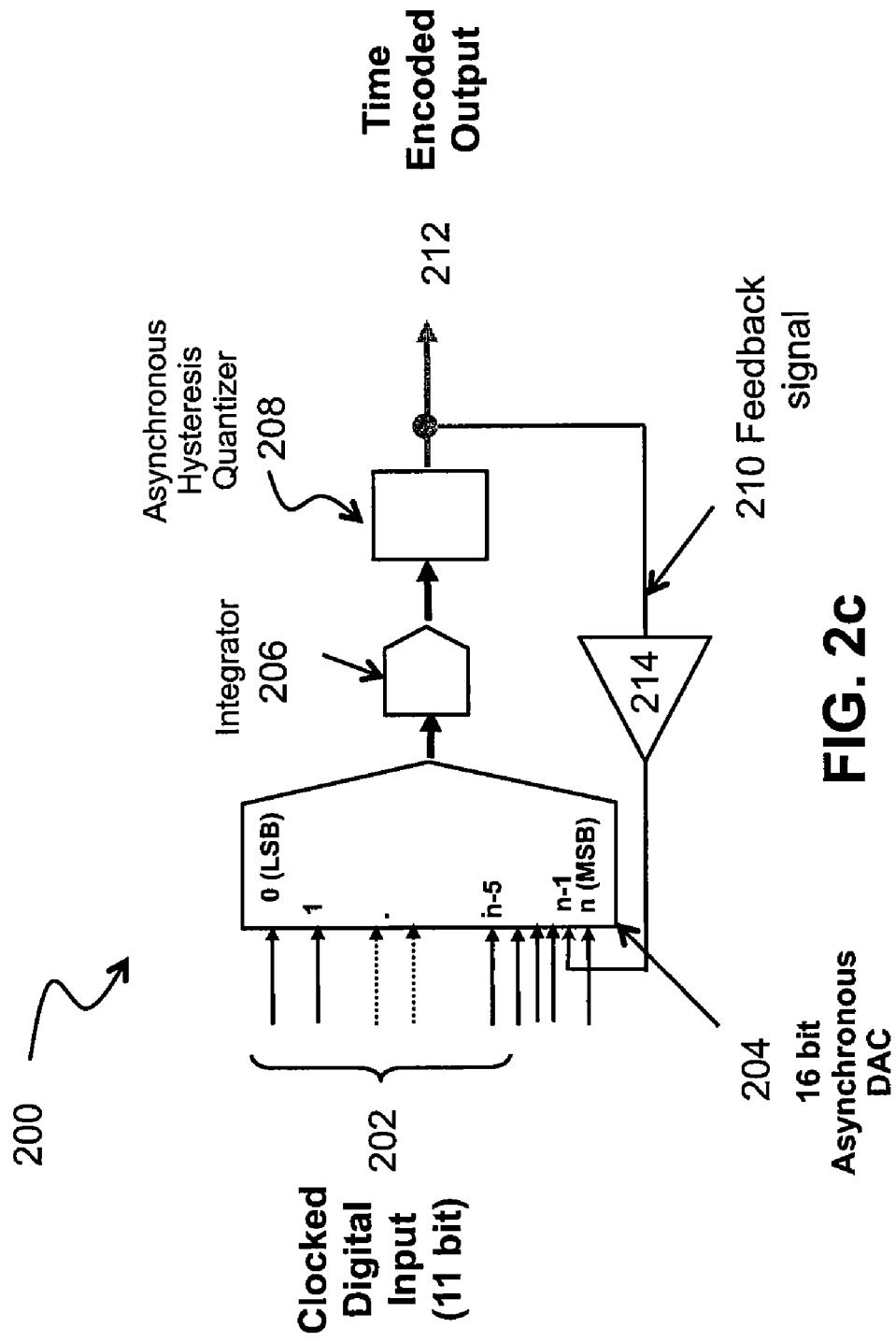

DIGITAL DOMAIN TO PULSE DOMAIN TIME ENCODER

CROSS-REFERENCE TO RELATED APPLICATIONS

The technology disclosed herein is related to the following US Patent Applications in that the digital domain to pulse domain encoder disclosed herein could be adapted for use in the disclosures of these prior patent applications:

U.S. Ser. No. 11/595,107 filed Nov. 10, 2006 and entitled "Pulse Domain Hadamard Gate";

U.S. Ser. No. 11/726,860 filed Mar. 23, 2007 and entitled "Spike Domain and Pulse Domain Non-Linear Processor";

U.S. Ser. No. 11/726,484 filed Mar. 22, 2007 and entitled "Analog to Digital Converter Using Asynchronous Pulse Technology";

the disclosures of which are hereby incorporated herein by this reference.

INCORPORATION BY REFERENCE

References cited within this application, including patents, published patent applications other publications, such as listed below:

A. Lazar and L Toth, "Perfect Recovery and Sensitivity Analysis of Time Encoded Bandlimited Signals," IEEE Trans. on Circuits and Systems-I, vol. 51, no. 10, pp. 2060-2073, October 2004; and M. Iwamoto, A. Jayaraman, G. Hannington, P. Chen, A. Bellora, W. Thornton, L. Larson and P. Asbeck, "Bandpass Delta-Sigma Class-S Amplifier" Electronic Letters, vol. 36, no. 12, June 2000, pp. 1010-1012;

are also hereby incorporated by reference in their entirety.

STATEMENT REGARDING FEDERALLY SPONSORED RESEARCH OR DEVELOPMENT

Not applicable.

BACKGROUND

1. Technical Field

This disclosure is generally related to an encoder and in particular to a digital encoder. This disclosure describes a circuit that can convert a conventional digital signal into a time encoded pulse signal. The output pulse signal has only two amplitude levels. The transition times of the output pulse are not aligned to a clock, but rather convey encoded information.

2. Description of Related Art

A typical single time encoder circuit includes a limit cycle oscillator. Such a single time encoder circuit can perform analog to pulse time encoded conversion. However, such a circuit is incapable of digital to pulse conversion. See A. Lazar and L Toth, "Perfect Recovery and Sensitivity Analysis of Time Encoded Bandlimited Signals," *IEEE Trans. on Circuits and Systems-I*, vol. 51, no. 10, pp. 2060-2073, October 2004.

In the prior art, there is no circuit for directly converting a digital signal into a pulse time encoded signal. The conversion from digital to pulse could have been done by doing first a conversion from the digital domain to the analog domain and then using a conventional time encoder to convert the analog domain signal into the pulse domain. FIG. 1 shows such a prior art analog to pulse domain time encoder. However, in such an approach the conventional time encoder requires an analog amplifier. The analog amplifier limits linearity and introduces noise. The new digital domain to pulse domain encoder disclosed herein eliminates the need for any linearity-limiting analog amplifier. The new circuit is also simpler as it does not require an addition operation before the integrator of the time encoder.

FIG. 1 is a block diagram of a prior art analog domain to pulse domain time encoder 100 which is known in the art. The time encoder 100 is responsive to an analog input signal 102 and generates a time encoded output signal 114. The analog input signal 102 is connected to an amplifier 104, the amplifier 104 is connected to an adder 106, the adder 106 is connected to an integrator 108, and the integrator 108 is connected to a quantizer 110, typically a hysteresis quantizer. A portion of an output of the quantizer 110 is fed back via an amplifier 112 to the adder 106. The time encoded output signal 114 is available at the output of the quantizer 110. The time encoder 100 encodes the analog input signal 102 into the time encoded output signal 114. If the analog input signal 102 is bandlimited, the analog input signal 102 can be encoded substantially without loss of information. That is, the analog input signal 102 can be recovered from a timing of the time encoded output signal 114. A time decoding machine can be used to recover the analog input signal 102 from the time encoded output signal 114. Assuming ideal elements no quantization error is introduced by this encoder 100.

A typical power analog amplifier, having an analog input and an analog output, includes a delta sigma modulator, an amplifier and a band-pass filter. This circuit provides high power amplification. However, such a circuit is incapable of time encoding without introducing additional quantization error. A delta sigma modulator in the power analog amplifier converts an analog input signal into pulses aligned to a clock introducing a quantization error. Furthermore, the power analog amplifier processes only an analog input, and not a digital input. See M. Iwamoto, A. Jayaraman, G. Hannington, P. Chen, A. Bellora, W. Thornton, L. Larson and P. Asbeck, "Bandpass Delta-Sigma Class-S Amplifier" *Electronic Letters*, vol. 36, no. 12, June 2000, pp. 1010-1012.

BRIEF SUMMARY OF THE INVENTION

The present disclosure provides a system and method for making a digital encoder.

Briefly described, in architecture, one embodiment of the system, among others, can be implemented as follows. The encoder has a digital-to-analog converter having a plurality of inputs and an output. The encoder also has an integrator having an input and an output, wherein the output of the digital-to-analog converter is connected to the input of the integrator. A quantizer has an input and an output, wherein the output of the integrator is connected to the input of the quantizer, and the output of the quantizer is connected to at least one of the plurality of inputs of the digital-to-analog converter.

The present disclosure can also be viewed as providing a method making a digital encoder. The method includes providing a digital-to-analog converter having a plurality of inputs and an output, providing an integrator having an input and an output, output of the digital-to-analog converter being connected to the input of the integrator, providing a quantizer having an input and an output, the output of the integrator being connected to the input of the quantizer; and connecting the output of the quantizer to at least one of the plurality of inputs of the digital-to-analog converter.

Other systems, methods, features, and advantages of the present invention will be, or will become apparent, to a person having ordinary skill in the art upon examination of the following drawings and detailed description. It is intended that all such additional systems, methods, features, and advantages included within this description, be within the scope of the present disclosure, and be protected by the accompanying claims.

BRIEF DESCRIPTION OF THE SEVERAL VIEWS OF THE DRAWINGS

Many aspects of the disclosure can be better understood with reference to the following drawings. Components in the drawings are not necessarily to scale, emphasis instead being placed upon clearly illustrating principles of the present invention. Moreover, in the drawing, like-referenced numerals designate corresponding parts throughout the several views.

FIG. 1 is a block diagram of a prior-art time encoder.

FIGS. 2a-2d are block diagrams of different embodiments of a time encoder according to the present disclosure.

DETAILED DESCRIPTION OF THE INVENTION

The present disclosure relates to a system and method for an encoder and in particular to a digital encoder.

As a person having an ordinary skill in the art would appreciate, an arrow entering a block or a symbol indicates an input and an arrow leaving a block or a symbol indicates an output. Similarly, connections described below may be of any electromagnetic type, such as electrical, optical, radio-frequency, and magnetic.

Figure 2A:
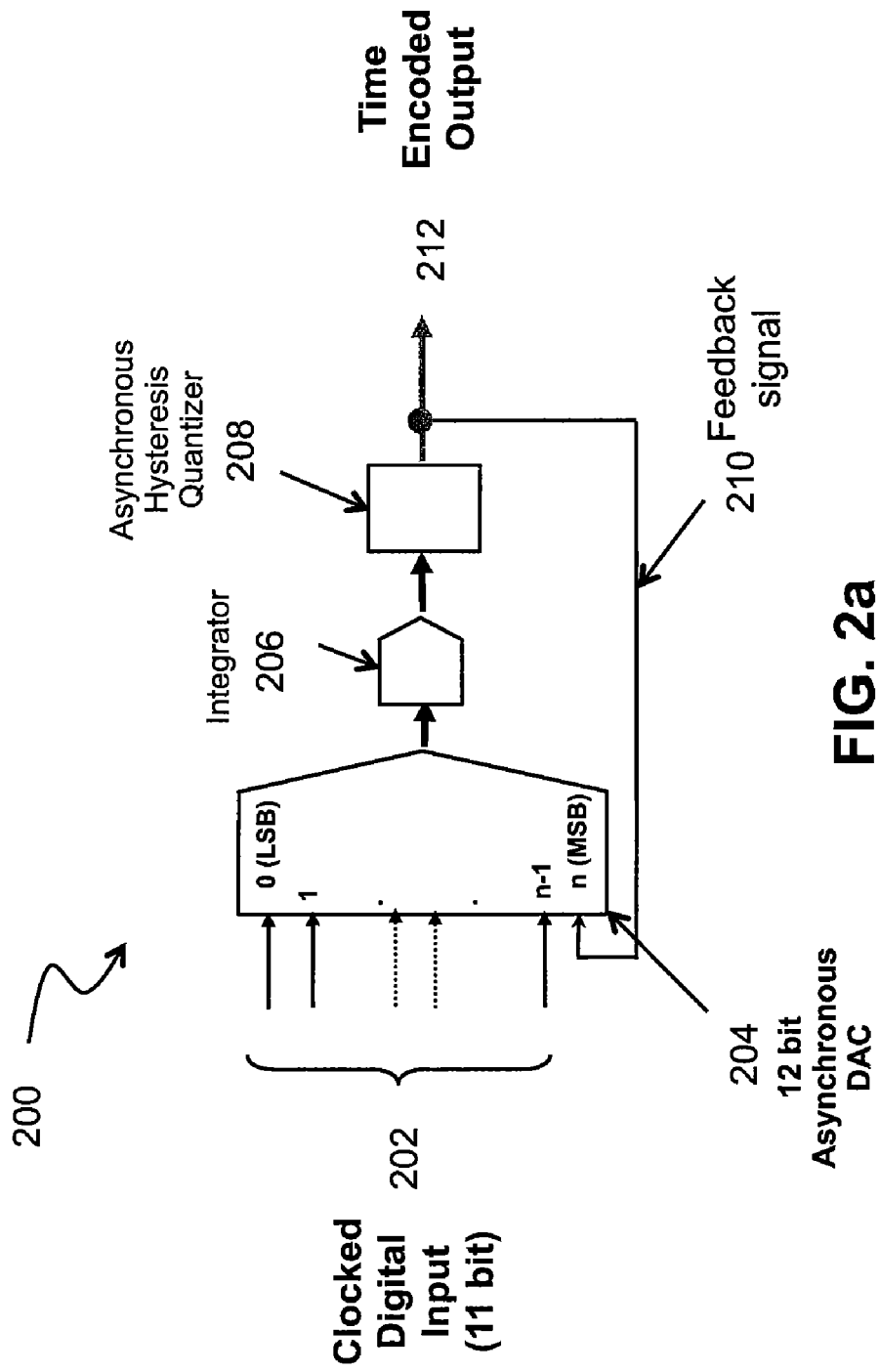

FIG. 2a is a block diagram of an embodiment of a time encoder 200 according to the present disclosure having a digital input time encoder 202. The digital input time encoder 200 has a clocked digital input 202 connected to a digital-to-analog converter (DAC) 204. An exemplary clocked digital input 202 may be an 11-bit clocked digital input signal 202 and an exemplary DAC 204 may be configured to process 12 bits (the DAC preferably processes at least one bit more than the number of bits in the input signal 202). As shown in FIG. 2a, the clocked digital input 202 is connected to bit 0, being the least significant bit (LSB), through bit n−1. The most significant bit (MSB) n of the DAC 204 is preferably used for processing a feedback signal 210 coming from an output 212 of a quantizer 208. The quantizer 208 should be a hysteresis quantizer and is preferably an asynchronous hysteresis quantizer. An optional feedback amplifier 214 (not shown in FIG. 2a, but shown for the embodiment of FIG. 2b) may be used in the feedback data bit line 210 in order to adjust logic levels between the quantizer 208 and the DAC 204 as needed.

Figure 2B:
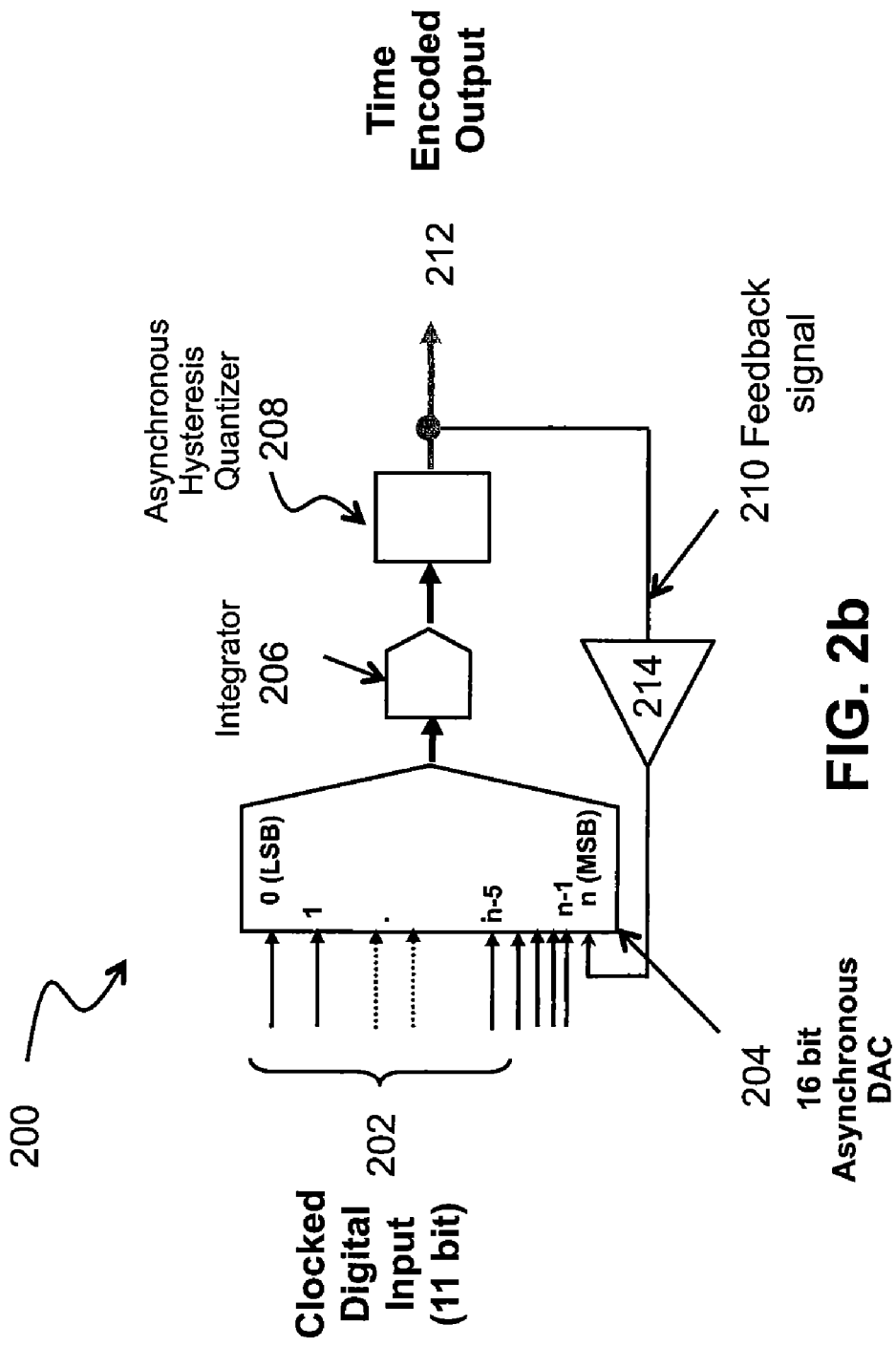

In the case of the embodiment of FIG. 2a, the DAC 204 has one more bit than the number of bits in digital input signal 202 and the feedback signal 210 is conveniently connected to the MSB of DAC 204 to make use of the additional bit in the DAC 204. However, the DAC 204 may have more bits than the number of bits in the input signal plus one. For example, the embodiment of FIG. 2b shows a DAC 204 which has five more bits than occur in the input signal 202. In this embodiment, the feedback signal is still shown going into the MSB of the DAC and the four DAC input bits between the most significant bit of the input data and the feedback bit are set to a logical constant value (such as zero). Also in this embodiment, the optional feedback amplifier 214 mentioned above is depicted, which amplifier can be used to adjust logic levels between the quantizer 208 and the DAC 204 as needed.

The optional feedback amplifier 214 can be a pulse amplifier or another type of amplifier as well such as a wide-banded analog amplifier.

The bit on the feedback line 210 does not necessarily have to be applied to the MSB of DAC 204, but the bit on the feedback line 210 should be applied to a more significant bit than any bit of the input data 202 when applied to the DAC 204. FIG. 2c shows such an embodiment, where the bit on the feedback line 210 has more significance than each bit in the input data 202, yet it is applied to an input of the DAC 204 having less significance than its MSB. In this case the unused connections to the DAC 204, including the MSB thereof, would be set to a logical constant value, such as logical zeros.

Figure 2D:
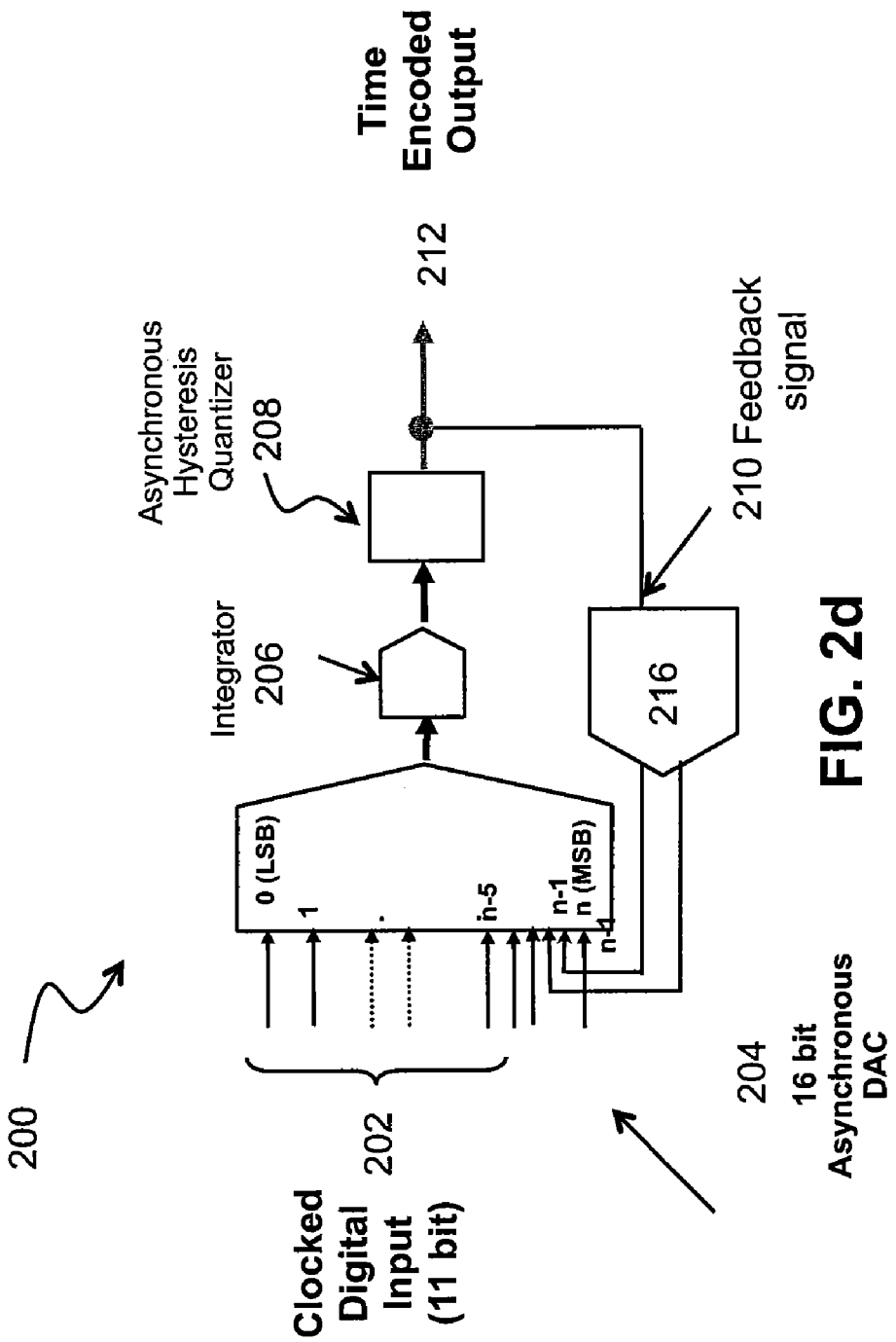

In the three embodiments discussed so far, the quantizer 208 has been a one-bit quantizer. However, multi-bit quantizers can be used if so desired. FIG. 2d shows an embodiment utilizing a 2-bit (four level) quantizer 208 whose output is applied to a ADC 216, whose two outputs (in this 2 bit embodiment) are applied to input of DAC 204 which are more significant than each bit in the input data 202.

FIGS. 2b-2d shows generalized cases in which the DAC 204 has more input bits than the number of bits of the input data 202 plus the number of bits in the quantizer 208. In these embodiments constant values are fed into some of the extra DAC inputs, typically the inputs corresponding to bits between the MSB of the input data and the MSB of the DAC (which often receives the feedback data on line 610). Occasionally it can be advantageous to apply the feedback data to an input (or inputs) of the DAC which is (are) still bitwise more significant than the input data, but less significant than the MSB of the DAC. This allows one to change the weighting of the input signal relative to the feedback signal, and allows control of the modulation depth of the resulting pulse signal.

The output of the DAC 204 is connected to an input of an integrator 206, whose output is connected to an input of the quantizer 208. A time encoded output is generated at the output 212 of the quantizer 208. The digital input time encoder 200 produces a pulse sequence. An average frequency of the pulse sequence may be 0.25 Hz, for example.

The DAC 204 is preferably configured for asynchronous operation, and the DAC 204 is preferably an asynchronous DAC 204. However, it is only the feedback signal which needs to be asynchronous. Since the digital input signal 202 is typically clocked, a hybrid synchronous-asynchronous DAC could be used if desired.

Figure 3:
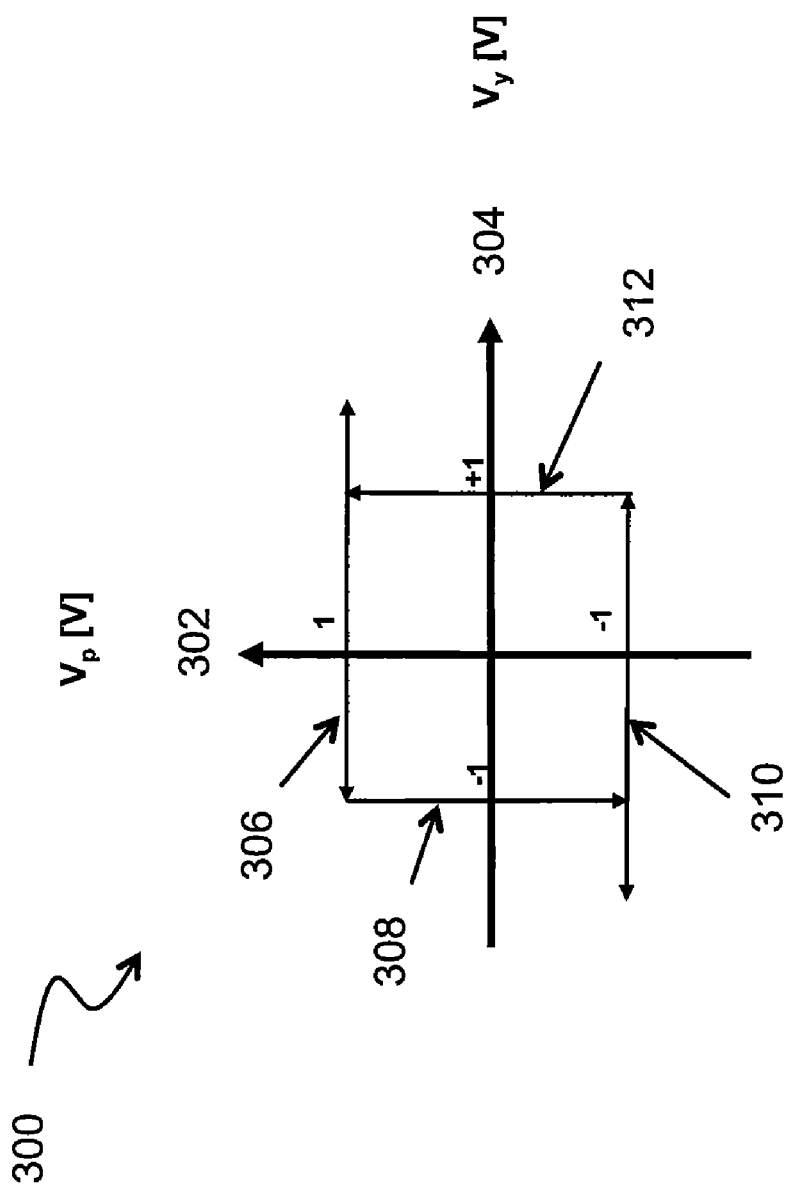
FIG. 3 is an illustration of a voltage relationship of a one-bit hysteresis quantizer.

FIG. 3 is an illustration of the voltage relationships 300 of a one bit hysteresis quantizer 208. The voltage relationship 300 is in a form of an Input-Output characteristics of the hysteresis quantizer. There are two possible output levels of −1 and +1. They are shown by horizontal lines 306, 310 of the voltage relationship 300. A transition between output levels 306, 310 occurs at two different input trigger voltage levels. Exemplary trigger voltage levels are normalized to −1V and +1V, for the sake of illustration only. They are shown by the vertical lines 308, 312 of the voltage relationship 300. The values of output levels 306, 310 and input trigger voltage levels can be scaled to a level suitable for a particular VLSI implementation, without substantially changing a basic operation of the digital input time encoder 200 of FIG. 2a, for example, by using the aforementioned amplifier 214. In FIG. 3 $V_p$ is the voltage at the output of the quantizer while $V_y$ is the voltage at the input of the quantizer 208. Since quantizers are well know in the art, it will not be further described here, nor will multi-bit quantizers be described as they are known in the art.

Figure 4:
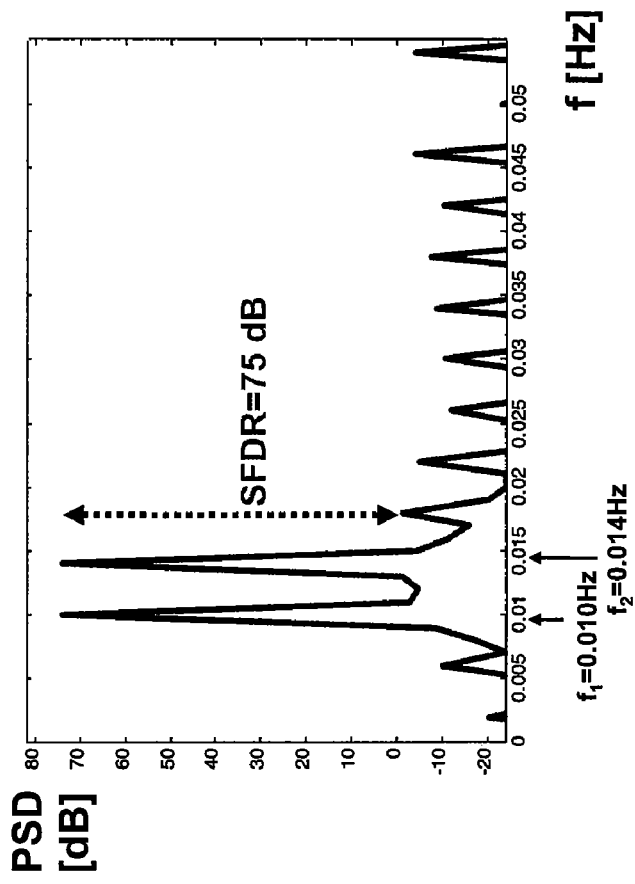
FIG. 4 is a plot of a spectrum of an input to the time encoder of the present disclosure.

FIG. 4 is a plot of a spectrum 400 of an input signal to the time encoder 200 used in an experiment. The input spectrum 400 of FIG. 4 shows power spectral density (PSD) versus frequency of an exemplary digital input signal, such as the clocked digital input 202 of FIG. 2. In this experiment, a two-tone input digital signal was used. The two-tone input digital signal had frequencies of 0.010 Hz and 0.014 Hz. The two-tone input digital signal was quantized both in amplitude and in time. In this experiment the two-tone input digital signal was quantized in amplitude to 11 bits, and quantized in time as with a clock of 10 Hz. That is, a sample was provided every 0.1 s. The input spectrum 400 was determined by performing an FFT (Fast Fourier Transform) on time domain data. Two tones $f_1$ and $f_2$ can be observed. The SFDR (Spurious Free Dynamic Range) is 75 dB. The SFDR is set by distortion introduced due to quantization using just 11 bits, for example.

Figure 5:
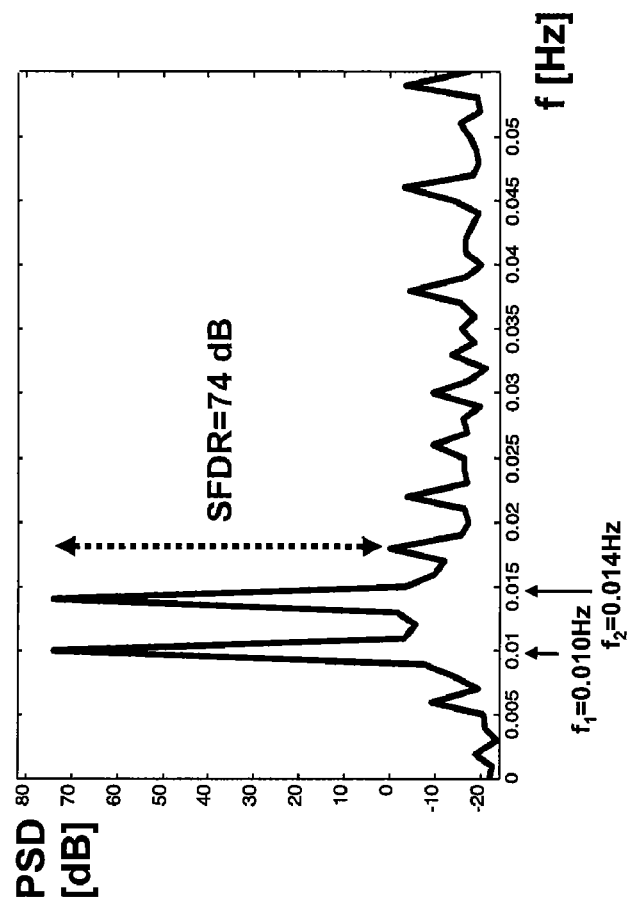
FIG. 5 is a plot of a spectrum of an output of the time encoder of the present disclosure.

FIG. 5 is a plot of a spectrum 500 of the output of the time encoder 200 used in this experiment. The output spectrum 500 shows power spectral density (PSD) versus frequency of the pulse output signal, such as the time encoded output signal 212 of FIG. 2. The output spectrum 500 was determined by performing an FFT on time domain data. The same two tones $f_1$ and $f_2$ can be observed. The output spectrum 500 shows an exemplary operation of the digital input time encoder 200 of FIG. 2a. In this experiment the SFDR of 74 dB in the output signal 212 is substantially identical to the SFDR of 75 dB shown in FIG. 4 for the input signal 202. That is, the time encoded output generated at the output 212 is substantially identical to the clocked digital input 202 according to this experiment. In this example, linearity is limited by an intrinsic quantization of the clocked digital input 202.

Figure 6:
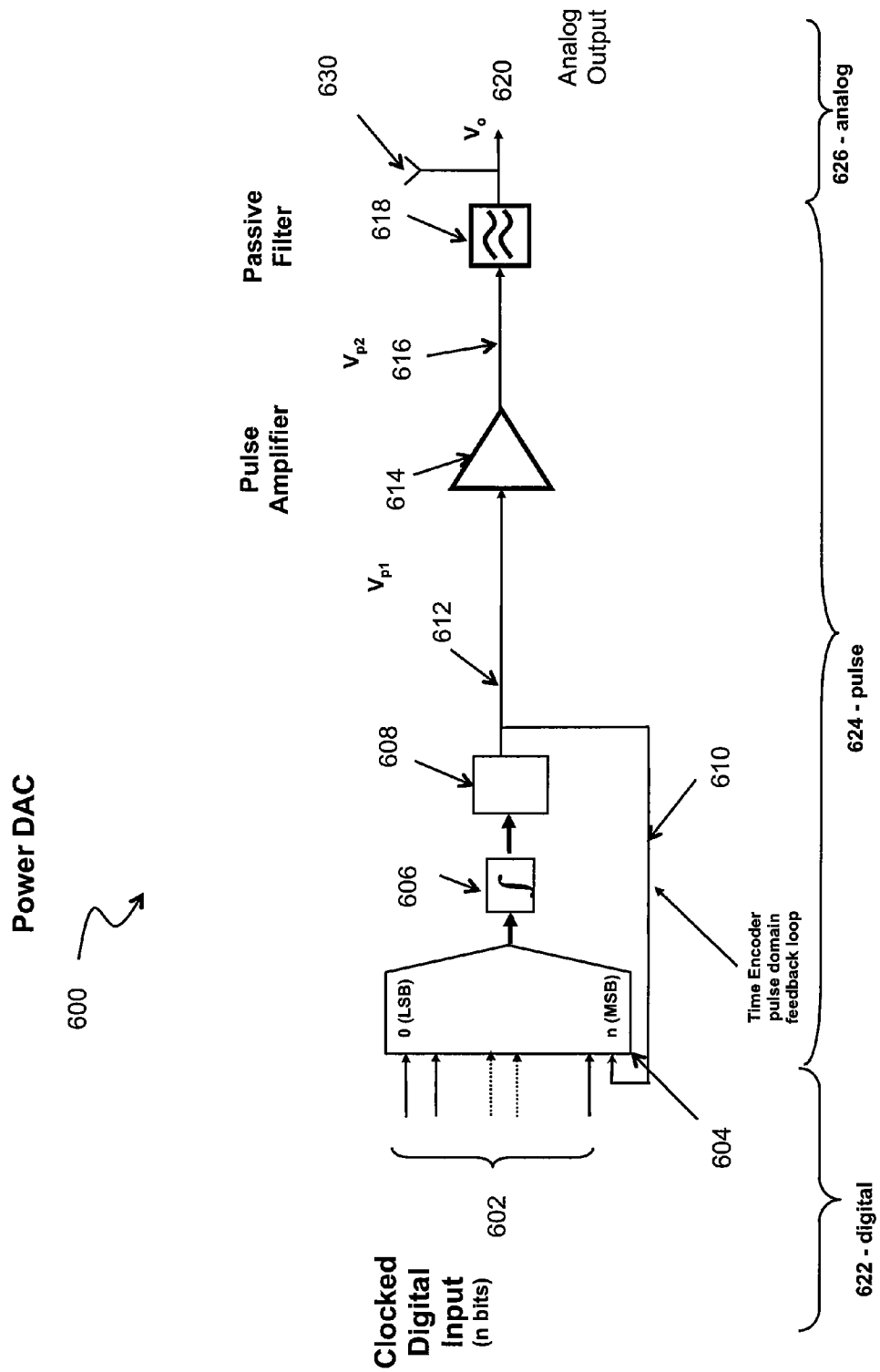
FIG. 6 is a block diagram of another embodiment of a time encoder of the present disclosure.

FIG. 6 is a block diagram of another embodiment of a time encoder according to the present disclosure. This embodiment is a power DAC 600. Similar to the block diagram for the digital input time encoder 200 of FIGS. 2a-2d, clocked digital input 602 is connected to the inputs other than an MSB of a DAC 604. An output of the DAC 604 is connected to an input of an integrator 606 and an output of the integrator 606 is connected to an input of a quantizer 608. An output signal $V_{p1}$, generated at an output 612 of the quantizer 608, is fed back in a form of a feedback signal 610 to a bit of the DAC 604 which is more significant than the MSB of the input data 602 (in FIG. 6 the feedback signal is applied to the MSB input (bit n) of the DAC 604, but it could be applied to a less significant input bit as previously described with reference to FIGS. 2b-2d). Again, the DAC 604 preferably has at least one more bit than which occurs in the digital input signal 602. If a multibit quantizer were utilized, then the DAC 604 should be at least as wide bitwise as the bitwise width of the input data 602 plus the feedback data 610. Also, if multibit quantizer were utilized, then an analog to digital convertor such as ADC 216 shown in FIG. 2d would also be utilized.

The output 612 of the quantizer 608 is also connected to an input of a pulse amplifier 614 which generates an output signal $V_{p2}$ at its output 616. This signal is preferably fed to an input of a passive filter 618 which may be a low pass or band pass filter having the effect or returning the pulse domain signals upstream thereof to the analog domain. The pulse amplifier 614, shown for illustrative purposes, could be another type of amplifier as well such as a wide-banded analog amplifier. At the output 620 of the passive filter 618 occurs an analog output signal, $V_o$. The output 620 may be connected to an antenna 630. The FIG. 6 also shows various domains of the power DAC 600, namely, a zone 622 is a digital domain, a zone 624 is a pulse domain, and a zone 626 is an analog domain.

The embodiment of FIG. 6 may be modified, for example, according to the modifications described above with reference to FIGS. 2a-2d.

Figure 7:
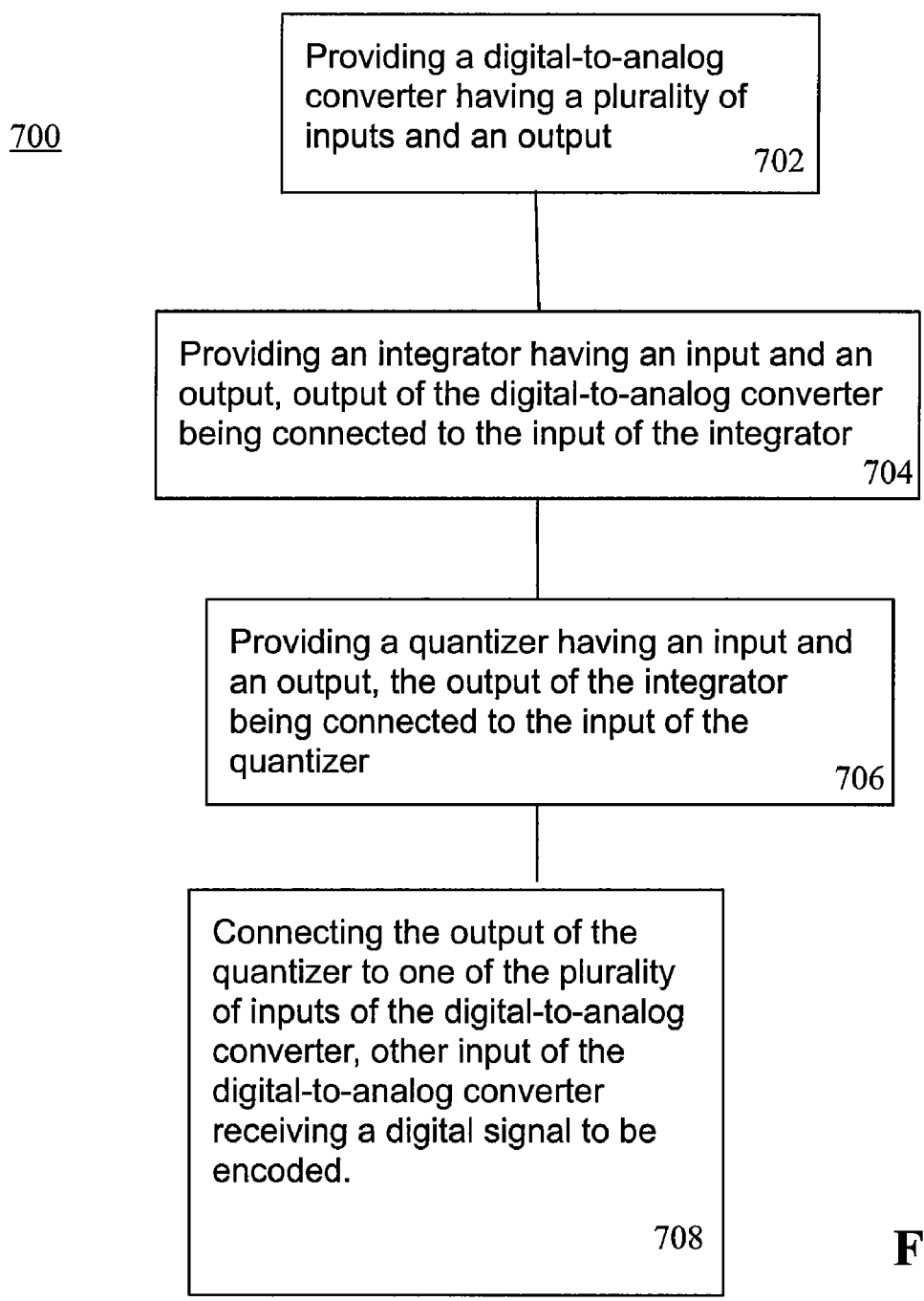
FIG. 7 is a flowchart of a method of encoding a digital signal.

FIG. 7 is a flowchart of a method 700 of encoding a digital signal. The method includes providing a digital-to-analog converter having a plurality of inputs and an output (see block 702), providing an integrator having an input and an output, the output of the digital-to-analog converter being connected to the input of the integrator (see block 704), providing a quantizer having an input and an output, the output of the integrator being connected to the input of the quantizer (see block 706), and feeding back the output of the quantizer into one of the plurality of inputs of the digital-to-analog converter, preferably the MSB input of the digital-to-analog converter (see block 708).

In the method 700, the providing the digital-to-analog converter of block 702 may further include connecting a digital signal to at least one of the multiple inputs of the digital-to-analog converter so that the method 700 then also includes generating a time-encoded output signal.

In the providing the digital-to-analog converter of block 702, the method may further include configuring the digital-to-analog converter for asynchronous operation. Similarly, in block 706 the providing the quantizer could include providing a hysteresis quantizer.

The providing the quantizer of block 706 may further include connecting the output of the quantizer to the one of the plurality of inputs, and preferably a most significant bit input, of the digital-to-analog converter. The providing the quantizer of block 706 may further include connecting the output of the quantizer to an input of an amplifier, the amplifier having the input and an output. Still further, the connecting the output of the quantizer to an input of an amplifier could include connecting the output of the quantizer to an input of a pulse amplifier. The connecting the output of the quantizer to the input of the pulse amplifier may further include connecting an output of the pulse amplifier to an input of a filter, the filter having the input and an output.

The foregoing method 700 or elements of the method 700 could also be stored on a computer-readable medium having computer-executable instructions to implement the method 700 or the elements of the method 700.

As used in this specification and appended claims, the singular forms "a," "an," and "the" include plural referents unless the specification clearly indicates otherwise. The term "plurality" includes two or more referents unless the specification clearly indicates otherwise. Further, unless described otherwise, all technical and scientific terms used herein have meanings commonly understood by a person having ordinary skill in the art to which the disclosure pertains.

As a person having ordinary skill in the art would appreciate, the elements or blocks of the methods described above could take place at the same time or in an order different from the described order.

It should be emphasized that the above-described embodiments are merely some possible examples of implementation, set forth for a clear understanding of the principles of the disclosure. Many variations and modifications may be made to the above-described embodiments of the invention without departing substantially from the principles of the invention. All such modifications and variations are intended to be included herein within the scope of this disclosure and the present invention and protected by the following claims.

In the claims the term "connected" is used to denote connections which include, but go beyond physical connections, so that the term also embraces connections of an operational or notional nature. For example, elements may be electro-magnetically "connected" although not physically connected and the term "connected" is intended to include both of these sorts of connections and other operational or notional connections.

What is claimed is:

1. An encoder comprising:
 a digital-to-analog converter having a plurality of inputs and an output;
 an integrator having an input and an output, the output of the digital-to-analog converter being connected to the input of the integrator;
 a quantizer having an input and an output, the output of the integrator being connected to the input of the quantizer; and
 the output of the quantizer being connected to at least one of the plurality of inputs of the digital-to-analog converter.

2. The encoder of claim 1, wherein a digital signal is connected to inputs of the digital-to-analog converter that are not connected to the output of the quantizer.

3. The encoder of claim 2, wherein a signal developed at the output of the quantizer is a time-encoded signal.

4. The encoder of claim 1, wherein the digital-to-analog converter is configured for asynchronous operation.

5. The encoder of claim 1, wherein the quantizer is a one-bit hysteresis quantizer.

6. The encoder of claim 1, wherein the output of the quantizer is connected to a one of the plurality of inputs corresponding to a more significant bit input of the digital-to-analog converter than the significance of its inputs which receive a digital signal inputted to the encoder.

7. The encoder of claim 1, wherein the output of the quantizer is connected to the one or more of the plurality of inputs of the digital-to-analog converter via a feedback amplifier.

8. The encoder of claim 7, wherein the feedback amplifier is a pulse amplifier.

9. The encoder of claim 1 wherein the output of the quantizer is connected to an output amplifier.

10. The encoder of claim 9, wherein the output amplifier is a pulse amplifier.

11. The encoder of claim 10, wherein an output of the pulse amplifier is connected to an input of a filter.

12. The encoder of claim 11, wherein an output of the filter is connected to an antenna.

13. The encoder of claim 1 wherein the quantizer is a multibit quantizer, the output of the multibit quantizer being connected, via an analog-to-digital converter, to inputs of the digital-to-analog converter corresponding to more significant bits of digital-to-analog converter than the inputs thereof connected to receive a digital input signal.

14. A method of time encoding a digital signal, the method comprising:
 providing a digital-to-analog converter having a plurality of inputs and an output;
 providing an integrator having an input and an output, the output of the digital-to-analog converter being connected to the input of the integrator;
 providing a quantizer having an input and an output, the output of the integrator being connected to the input of the quantizer; and
 coupling the output of the quantizer to at least one of the plurality of inputs of the digital-to-analog converter, said at least one of the plurality of inputs being more significant bitwise than any of other inputs of the digital-to-analog converter associated with receiving said digital signal.

15. The method of claim 14, wherein the providing the digital-to-analog converter further includes connecting a digital signal to said other inputs of the digital-to-analog converter.

16. The method of claim 14, wherein the providing the digital-to-analog converter further includes configuring the digital-to-analog converter for asynchronous operation.

17. The method of claim 14, wherein the providing the quantizer includes providing a one-bit hysteresis quantizer.

18. The method of claim 14, wherein the providing the quantizer includes providing a multi-bit hysteresis quantizer and wherein the coupling the output of the quantizer to at least one of the plurality of inputs of the digital-to-analog converter occurs via an analog to digital converter.

19. The method of claim 14, wherein the providing the quantizer further includes connecting the output of the quantizer to the one of the plurality of inputs for a most significant bit input of the digital-to-analog converter.

20. The method of claim 14, wherein the providing the quantizer further includes connecting the output of the quantizer to an input of an amplifier, the amplifier having the input and an output, the amplifier preferably being a pulse amplifier.

* * * * *